(12) United States Patent
Grodzki

(10) Patent No.: US 9,684,049 B2
(45) Date of Patent: Jun. 20, 2017

(54) MAGNETIC RESONANCE METHOD AND APPARATUS FOR CORRECTION OF MAGNETIC RESONANCE DATA

(71) Applicant: David Grodzki, Erlangen (DE)

(72) Inventor: David Grodzki, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 785 days.

(21) Appl. No.: 14/039,228

(22) Filed: Sep. 27, 2013

(65) Prior Publication Data

US 2014/0084924 A1    Mar. 27, 2014

(51) Int. Cl.
*G01R 33/565*    (2006.01)

(52) U.S. Cl.
CPC ...... *G01R 33/565* (2013.01); *G01R 33/56509* (2013.01)

(58) Field of Classification Search
CPC ............... G01R 33/565; G01R 33/56509
See application file for complete search history.

(56) References Cited

U.S. PATENT DOCUMENTS

| | | | |
|---|---|---|---|
| 5,025,217 A * | 6/1991 | Van Vaals | G01R 33/385 324/322 |
| 2004/0189299 A1* | 9/2004 | Ikezaki | G01R 33/56545 324/309 |
| 2006/0001424 A1 | 1/2006 | Harvey et al. | |
| 2008/0154117 A1 | 6/2008 | Nielles-Vallespin | |

OTHER PUBLICATIONS

Zurek et al., "Accurate T1 mapping in rodent lungs using ultrashort echo-time MRI"; Proc, Intl. Soc. Mag. Reson. Med.; vol. 12; p. 3975; (2012).
Grodzki et al., "Ultrashort Echo Time Imaging Using Pointwise Encoding Time Reduction With Radial Acquisition (PETRA)"; Magnetic Resonance in Medicine; vol. 67; pp. 510-518; (2012).
Sonia Nielles-Vallesin et. al., "3D Radial Projection Technique with Ultrashort Echo Times for Sodium MRI: Clinical Applications in Human Brain and Skeletal Muscle;" Magnetic Resonance in Medicine, vol. 57, pp. 74-81 (2007).
Kober et al.: "Head Motion Detection Using FID Navigators", Magnetic Resonance in Medicine vol. 66, pp. 135-143 (2011).

(Continued)

*Primary Examiner* — Rodney Bonnette
(74) *Attorney, Agent, or Firm* — Schiff Hardin LLP

(57) ABSTRACT

In a method and apparatus to acquire correction data in connection with pulse sequences to acquire measurement data whose echo times—the duration between excitation and measurement data acquisition of the pulse sequences—are less than 500 microseconds, the pulse sequences acquire measurement data by repetition of a pulse sequence scheme, wherein different gradients for spatial coding are switched in each repetition, and correction data are acquired every n repetitions in a time window in which no gradients are switched, wherein n is a predetermined natural number. The method and apparatus enable correction of measurement data with which solid substances can be depicted without the hardware being used needing to be adapted and without external sensors being necessary.

10 Claims, 3 Drawing Sheets

(56) References Cited

OTHER PUBLICATIONS

Weiger et al.. "MRI with Zero Echo Time: Hard versus Sweep Pulse Excitation," Magnetic Resonance in Medicine, vol. 66, pp. 379-389 (2011).
Grodzki et al., "Ultra short Echo Time Imaging using Pointwise Encoding Time reduction with Radial Acquisition (PETRA)", Proc. Intl. Soc. Mag. Reson. Med. vol. 19, p. 2815 (2011).
Brau et al: "Generalized Self-Navigated Motion Detection Technique: Preliminary Investigation in Abdominal Imaging", Magn. Res. Med. vol. 55, pp. 263-270, (2008).

* cited by examiner

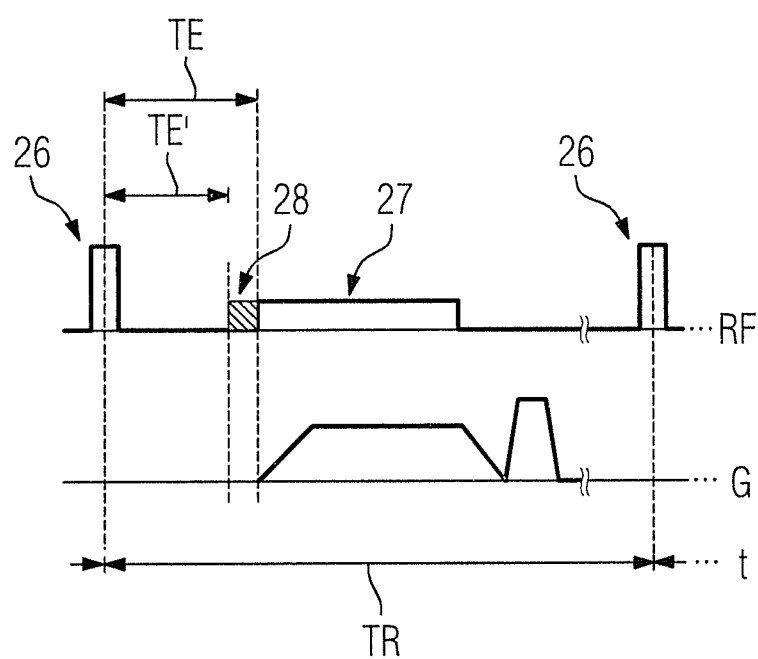

MAGNETIC RESONANCE METHOD AND APPARATUS FOR CORRECTION OF MAGNETIC RESONANCE DATA

BACKGROUND OF THE INVENTION

Field of the Invention

The present invention concerns: a method to acquire correction data in connection with pulse sequences for the acquisition of magnetic resonance measurement data whose echo times—the duration between excitation and measurement data acquisition of said pulse sequences—is less than 500 microseconds, as well as a magnetic resonance apparatus and an electronically readable data medium for implementing such a method.

Description of the Prior Art

Magnetic resonance (MR) is a known modality with which images of the inside of an examination subject can be generated. Expressed in a simplified form, the examination subject is positioned in a strong, static, homogeneous basic magnetic field (also called a $B_0$ field) with a field strength from 0.2 Tesla to 7 Tesla or more in a magnetic resonance apparatus, such that the nuclear spins of the examination subject orient along the basic magnetic field. To trigger magnetic resonance signals, radio-frequency excitation pulses (RF pulses) are radiated into the examination subject, and the triggered magnetic resonance signals are detected and entered into data points in an electronic memory organized as k-space from the k-space data, MR images are reconstructed or spectroscopy data are determined. For spatial coding of the measurement data, rapidly switched magnetic gradient fields are superimposed on the basic magnetic field in the memory. The acquired measurement data are digitized and stored as complex numerical values in a k-space matrix. An associated MR image can be reconstructed from the k-space matrix populated with values, for example by means of a multidimensional Fourier transformation.

In comparison to computed tomography (CT) examinations, for example, MR examinations normally take a relatively long amount of time. Due to the longer duration, MR examinations are susceptible to patient movements during the measurement. Depending on the pulse sequence type that is used and the type of the examination, movements of the examination subject can create artifacts in the reconstructed image that can make a diagnosis impossible.

The contrast responses of CT and MR examinations are also very different. While MR examinations provide a very good soft tissue contrast, CT examinations are especially suitable for the measurement of solid substances such as bones. In most standard pulse sequences, such solid substances deliver no signal since the signal of a solid substance decays rapidly.

Pulse sequences with very short echo times TE—for instance TE less than 0.5 milliseconds—offer new fields of application here for nuclear magnetic resonance tomography (MR tomography). They enable the depiction of substances that cannot be depicted with conventional sequences such as (T)SE ((Turbo) Spin Echo) or GRE (gradient echo) since their respective decay time of the transversal magnetization T2 of these substances is markedly shorter than the possible echo times of the conventional sequences, and their signal has therefore already decayed at the point in time of acquisition. In contrast, with echo times in the range of these decay times it is possible to depict the signals of these substances in an MR image, for example. The decay times T2 of teeth, bones or ice lie between 30 and 80 microseconds, for example.

The use of sequences with ultrashort echo times (UEZ sequences) thus enables (for example) bone and/or dental imaging and/or the depiction of cryoablations by means of MR and positron emission tomography, and is usable for MR-PET (combination of MR and positron emission tomography, PET) or PET attenuation correction.

Examples of UEZ sequences are: UTE ("Ultrashort Echo Time"), for example as it is described in the article by Sonia Nielles-Vallespin, "3D radial projection technique with ultrashort echo times for sodium MRI: Clinical applications in human brain and skeletal muscle", Magn. Res. Med. 2007, 57, Pages 74-81; PETRA ("Pointwise Encoding Time reduction with Radial Acquisition") as it is described by Grodzki et al. in "Ultra short Echo Time Imaging using Pointwise Encoding Time reduction with Radial Acquisition (PETRA)", Proc. Intl. Soc. Mag. Reson. Med. 19 (2011), Page 2815; or z-TE as it is described by Weiger et al. in "MRI with zero echo time: hard versus sweep pulse excitation", Magn. Reson. Med. 66 (2011), Pages 379-389.

In these sequence types, usually a hard delta pulse is applied as a radio-frequency excitation pulse and the data acquisition is subsequently begun as quickly as possible by the hardware, or with an echo time of less than 500 microseconds between the excitation by the excitation pulse and the beginning of the data acquisition. In PETRA or z-TE, the gradients are already activated during the excitation. In UTE, the gradients are ramped up to the desired strength with the beginning of the data acquisition.

Sequences with ultrashort echo times are also movement-sensitive. Increased movement—and therefore more pronounced movement artifacts—can occur precisely given sequences with low noise development (such as in PETRA).

In general, in MR imaging various approaches are pursued in order to design MR examinations to be more movement-resistant. For example, it is sought to optimize the strategy of acquiring the measurement data by means of the pulse sequence, for instance via radial acquisition techniques or BLADE. Other methods attempt to supervising the (disruptive) movement, either via MR-based monitoring (for instance via intermediate scans or navigators) for localization of the examination subject or also via external sensors, for example with the aid of what are known as markers with which a movement during the examination can be externally observed. The knowledge obtained in such a manner about the movement during the examination can be utilized—either in post-processing steps (post-processing) of the measurement data and/or reconstructed image data—to make corrections, or also to detect portions of acquisition in which a significant movement took place, and to discard these and repeat them instead.

One approach for MR-based movement correction uses measurements (data acquisitions) known as FID (free induction decay) measurements, which are executed between the actual measurements of the measurement data for image reconstruction. Such an FID-based movement correction method is, for example, described in the article by Brau and Brittain: "Generalized Self-Navigated Motion Detection Technique Preliminary Investigation in Abdominal Imaging", Magn. Res. Med. 55:263-270, 2008, or also in connection with multichannel coils in the article by Kober et al.: "Head Motion Detection Using FID Navigators", Magn. Res. Med 66:135-143, 2011. Refocused, measured FID signals are thereby compared with a reference value. Depending on the clearance of the examination subject from the reception coil used for the FID measurement, a different intensity is measured. If the position of the examination subject has varied between the individual FID measurements, a different intensity is also measured in the individual FID measurements. A movement therefore can be detected, and specific measurements of measurement data for image reconstruction can be discarded and/or repeated on the basis of this movement information.

SUMMARY OF THE INVENTION

An object of the present invention is to provide a method to acquire correction data for correcting MR data, and to provide a magnetic resonance system and an electronically readable data medium that enable correction of MR measurement data that depict solid substances.

In the method in accordance with the invention to acquire correction data in connection with pulse sequences for acquisition of measurement data whose echo times—the duration between excitation and measurement data acquisition of the pulse sequences—is less than 500 microseconds, the pulse sequences acquire measurement data by repetition of a pulse sequence scheme, wherein, in every repetition different gradients are switched (activated) for spatial coding, and correction data are acquired every n repetitions in a time window in which no gradients are switched, wherein n is a predetermined natural number.

The method according to the invention enables a reliable correction of measurement data with which solid substances can be depicted, without the hardware that is hereby used needing to be adapted or external sensors being necessary.

A magnetic resonance system according to the invention has a basic field magnet, a gradient field system, a radio-frequency antenna, and a control device to control the gradient field system and the radio-frequency antenna, and an image computer to receive measurement signals received by the RF antenna, to evaluate the measurement signals and to create magnetic resonance images. The control device includes a correction device to control the acquisition of correction data and to process correction data. The magnetic resonance system is designed to implement the method according to the invention as described herein.

An electronically readable data storage medium according to the invention encoded with electronically readable control information stored that cause the method according to the invention as described herein to be executed by a magnetic resonance system control device in which the data storage medium is loaded.

The advantages and embodiments described with regard to the method apply analogously to the magnetic resonance system and the electronically readable data storage medium.

BRIEF DESCRIPTION OF THE DRAWINGS

FIG. 4 is a schematic representation of a portion of an additional pulse sequence to acquire measurement data with acquisition of correction data according to the invention.

DESCRIPTION OF THE PREFERRED EMBODIMENTS

Figure 1:
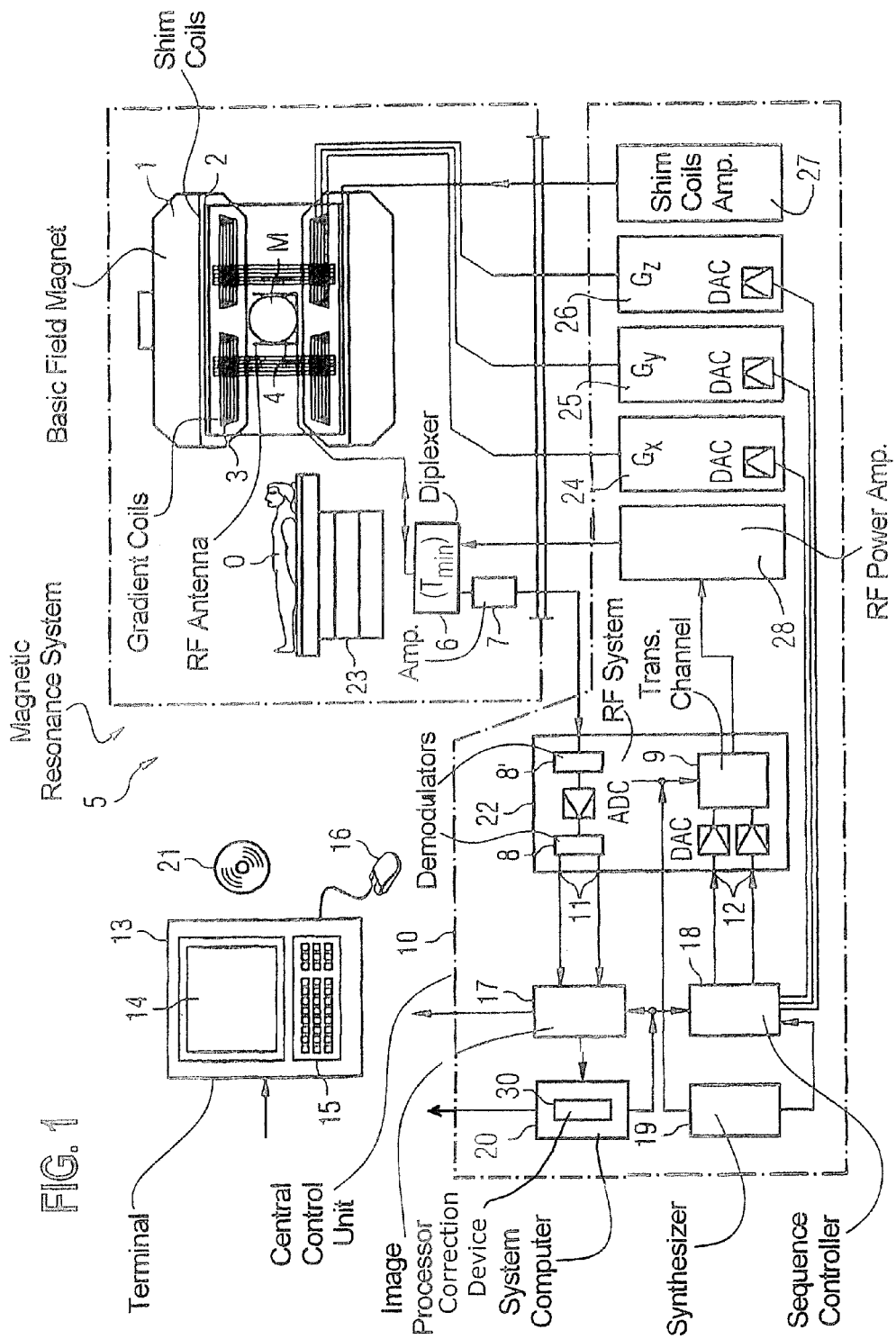
FIG. 1 schematically illustrates a magnetic resonance system according to the invention.

FIG. 1 schematically shows a magnetic resonance system 5 (a magnetic resonance imaging or magnetic resonance tomography apparatus). A basic field magnet 1 generates a temporally constant, strong magnetic field for polarization or alignment of the nuclear spins in an examination region of an examination subject U (for example a part of a human body that is to be examined). The subject U which lies on a table 23 and is moved into the magnetic resonance system 5. The high homogeneity of the basic magnetic field that is required for the magnetic resonance measurement (data acquisition) is defined in a typically (but not necessarily) spherical measurement volume M in which are arranged the parts of the human body that are to be examined. To support the homogeneity requirements, and in particular to eliminate temporally invariable influences, shim plates made of ferromagnetic material are mounted at a suitable location. Temporally variable influences are eliminated by shim coils 2 and a suitable activation 27 for the shim coils 2.

In the basic field magnet 1, a cylindrical gradient coil system 3 is used that has three sub-windings. Each sub-winding is supplied by a corresponding amplifier 24-26 with current to generate a linear gradient field in the respective direction of the Cartesian coordinate system. The first sub-winding of the gradient field system 3 thereby generates a gradient $G_x$ in the x-direction, the second sub-winding generates a gradient $G_y$ in the y-direction, and the third sub-winding generates a gradient $G_z$ in the z-direction. The amplifiers 24-26 each include a digital/analog converter (DAC) that is controlled by a sequence controller 18 for accurately-timed generation of gradient pulses.

Located within the gradient field system 3 is a radio-frequency antennas 4 that converts the radio-frequency pulses emitted by a radio-frequency power amplifier into an alternating magnetic field for excitation of the nuclei and alignment of the nuclear spins of the subject to be examined, or of the region of the subject that is to be examined. The radio-frequency antenna 4 has one or more RF transmission coils and one or more RF reception coils in the form of an arrangement (for example annular, linear or matrix-like) of coils. If the radio-frequency antenna 4 has multiple individual coils—i.e. RF reception coils—and is thus a multi-channel reception coil, correction data can thus be acquired with particularly high spatial resolution. The alternating field emanating from the precessing nuclear spins—i.e. normally the spin echo signals caused by a pulse sequence made up of one or more radio-frequency pulses and one or more gradient pulses—is converted by the RF reception coils of the radio-frequency antenna 4 into a voltage (measurement signal) that is supplied via an amplifier 7 to a radio-frequency reception channel 8, 8' of a radio-frequency system 22. The radio-frequency system 22 furthermore has a transmission channel 9 in which the radio-frequency pulses are generated for the excitation of the nuclear magnetic resonance. The respective radio-frequency pulses are digitally represented in the sequence controller 18 as a series of complex numbers based on a pulse sequence predetermined by the system computer 20. This number sequence is supplied as a real part and imaginary part to a digital/analog converter (DAC) in the radio-frequency system 22 via respective inputs 12, and from the digital/analog converter to the transmission channel 9. In the transmission channel 9, the pulse sequences are modulated on a radio-frequency carrier signal having a base frequency that corresponds to the center frequency. The modulated pulse sequences are supplied via an amplifier 28 to the RF transmission coil of the radio-frequency antenna 4.

The switching from transmission operation to reception operation takes place via a transmission/reception diplexer 6 which requires a minimum switching time $T_{min}$ to switch from transmission mode to reception mode. The RF transmission coil of the radio-frequency antenna 4 radiates the radio-frequency pulses for excitation of the nuclear spins into the measurement volume M and scans resulting echo signals via the RF reception coils. The correspondingly acquired nuclear magnetic resonance signals are phase-sensitively demodulated to an intermediate frequency in a first demodulator 8' of the reception channel of the radio-frequency system 22 and digitized in an analog/digital converter (ADC). This signal is further demodulated to a frequency of 0. The demodulation to a frequency of 0 and the separation into real part and imaginary part occur in a second demodulator 8 after the digitization in the digital domain, which second demodulator 8 outputs the demodulated data via outputs 11 to an image computer 17.

An MR image is reconstructed by the image computer 17 from the measurement data acquired in such a manner, in particular using correction methods to correct artifacts for which the control unit 10 has (for example) a correction device 30 for the processing of correction data. This correction device 30 is furthermore designed to control the acquisition of correction data, and for this is comprised by the system computer 20, for example. The administration of the measurement data, the image data and the control programs likewise takes place via the system computer 20, for example. Based on a specification with control programs, the sequence controller 18 monitors the generation of the respective desired pulse sequences and the corresponding scanning of k-space, and therefore acquisition of the measurement data and the correction data. In particular, the sequence controller 18 controls the accurately-timed switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an acquisition of measurement data (which control programs are stored on a DVD 21, for example), as well as other inputs on the part of the user and the presentation of the generated MR image, take place via a terminal 13 that has input means—for example a keyboard 15 and/or a mouse 16—to enable an input and display means—for example a monitor 14—to enable a display.

Figure 2:
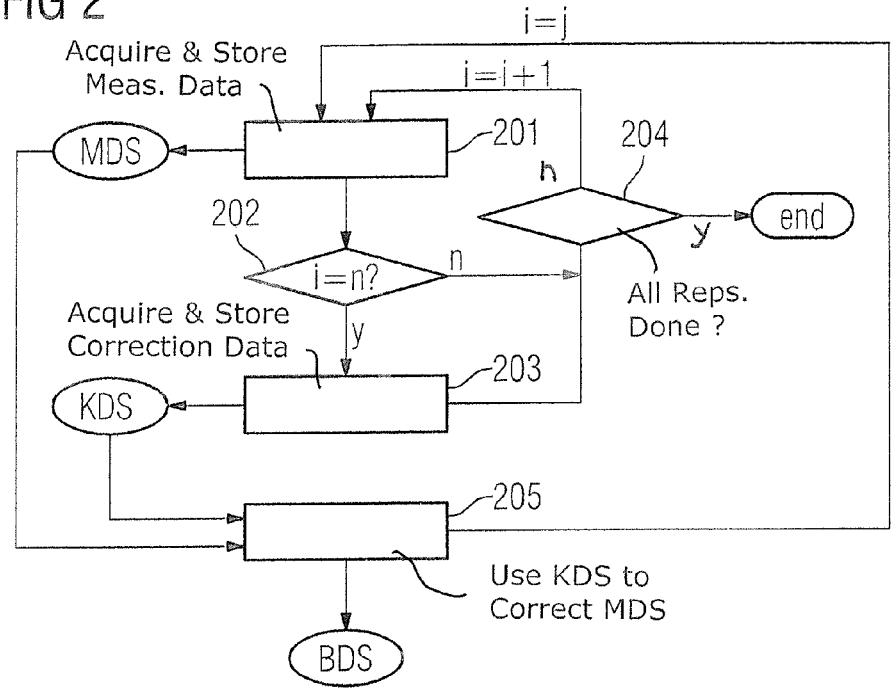
FIG. 2 is a flowchart of an embodiment of the method according to the invention for the acquisition of correction data in connection with pulse sequences for the acquisition of measurement data, having echo times—the duration between excitation and measurement data acquisition of the pulse sequences—less than 500 microseconds.

FIG. 2 shows a flowchart of a method according to the invention for the acquisition of correction data in connection with pulse sequences for the acquisition of measurement data whose echo times—the duration between excitation and measurement data acquisition of the pulse sequences—is less than 500 microseconds, wherein the pulse sequences acquire measurement data via repetition of a pulse sequence scheme, wherein different gradients for spatial coding are switched in each repetition, and wherein correction data are acquired every n repetitions in a time window in which no gradients are switched, wherein n is a predetermined natural number.

A repetition of the pulse sequence that is used corresponds to a duration of the repetition time TR. The time between two acquisitions of correction data therefore results as n*TR. The selection of the number n in particular conforms to the desired resolution capability of the movement monitoring via the correction data. If a very dense movement monitoring is desired, n can be chosen to be small (for example even n=1). If a course-meshed [sic] monitoring of the movement is sufficient, n can be chosen to be greater.

For this purpose, in Step 201 measurement data are acquired and stored in a measurement data set MDS within the scope of a first repetition (i=1) of the pulse sequence that is used. A query 202 checks whether correction data should be acquired before the next repetition i=i+1. This in particular occurs in that the index of the repetition i is compared with the natural number n predetermined by the user, which predetermines when correction data should be acquired. If the query 202 returns that correction data should be acquired (downward arrow "y"), in Step 203 correction data are acquired and stored in a correction data set KDS in a time window in which no gradients are switched. If the query 202 returns that no correction data should be acquired (arrow "n" to the right), or after an acquisition of correction data has been implemented, in a query 204 a check is made as to whether all desired repetitions (and therefore all desired measurement data and correction data) have been acquired. If the query 204 returns that all desired measurement data and correction data have been acquired, the acquisition of measurement and correction data ends ("end"). If the query 204 returns that additional measurement data and/or correction data should be acquired, in a next repetition of the pulse sequence (i=i+1) measurement data are acquired again and stored in the measurement data set MDS in Step 201. Steps 201 through 204 repeat until all desired measurement data and correction data are acquired and stored in the measurement data set MDS and the correction data set KDS. The workflow thereby does not necessarily need to begin with the acquisition of measurement data (Step 201); rather, it can also be begun with the acquisition of correction data (Step 203), after which the method proceeds as described above.

The correction data are preferably measured during the free induction decay (FID) directly after an excitation via an excitation pulse of the pulse sequence, as is later stated in further detail with reference to FIGS. 3 and 4.

The correction data acquired and stored in the correction data set in this way can be further used for correction in particular for movement correction of the measurement data (acquired with the pulse sequence and stored in the measurement data set MDS) by means of an FID-based movement correction method. For example, for this a correction of the acquired measurement data is implemented in Step 205 on the basis of the acquired correction data. For example, this occurs according to an FID-based movement correction method described in one of the two articles by Brau and Britain or, respectively, by Kober et al. that was already cited above. Individual repetitions (i=j) can possibly be repeated in order to acquire new measurement data that replace the previous measurement data of the repetition i=j, if it is established that an interfering movement occurred during the originally implemented repetition i=j. A movement-corrected image data set BDS can be reconstructed from the measurement data corrected on the basis of the correction data set KDS and be displayed and/or stored.

If the correction data were acquired by means of a multichannel reception coil comprising multiple individual coils, the acquired correction data can be analyzed per individual coil (i.e. separately for each individual coil) within the scope of the FID-based movement correction method. An increased precision can therefore be achieved in the movement analysis.

Figure 3:
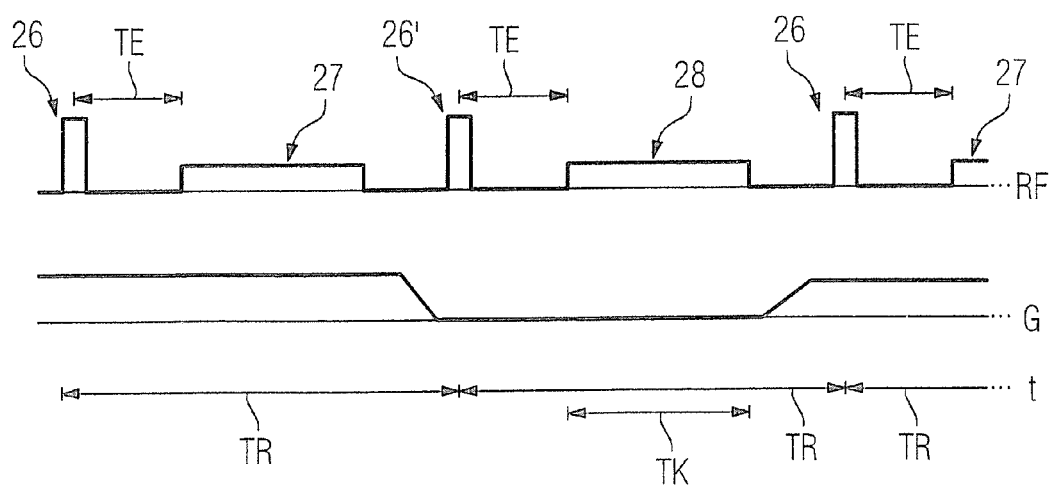
FIG. 3 is a schematic representation of a section of a pulse sequence to acquire measurement data with acquisition of correction data according to the invention.

FIG. 3 shows a schematic representation of a section of a pulse sequence for the acquisition of measurement data with acquisition of correction data according to the invention. Shown in the upper line (RF) are the radiated excitation pulses 26 and the acquisition blocks for acquisition of the radio-frequency signals 27, 28 for the acquisition of the measurement data and the correction data. Shown in the second line G are the switched gradients. The lower line t shows the time curve.

As is apparent, given the pulse sequence (shown in sections) that is used, gradients G are switched simultaneously during the radiation of an excitation pulse 26 at every repetition of the duration TR (repetition time) if measurement data are acquired after the excitation pulse 26 (Acquisition 27).

In every n repetitions, the gradients are ramped down for a predetermined time window for the acquisition of the correction data, and are deactivated for the actual acquisition 28 of the correction data (within time window TK). For this purpose, for example, an excitation pulse 26' can be radiated and the acquisition 28 of the correction data can be begun after the echo time TE. The echo time is hereby sufficiently short in order to acquire—with the acquisition 28—the free induction decay of the spins occurring directly after the excitation 26'. After acquisition 28 of the correction data, for a subsequent repetition of the pule sequence for acquisition of the measurement data the gradient is initially ramped to the strength desired for the pending repetition, before the next excitation pulse 26 of the pulse sequence is radiated. The acquisition of measurement data is continued with the next n repetitions of the pulse sequence until the next acquisition of correction data.

The movement of the gradients from a strength desired in one repetition to the strength desired in the following repetition, as well as the ramping down of the gradients to "zero" (deactivation) for acquisition of correction data and the ramping up of the gradients for the next acquisition of measurement data after the acquisition of correction data, in particular take place with a slew rate which can create no (or at most little) mechanical load at the gradient system, and therefore no (or at most a little) noise development. The ME examination is therefore particularly quiet and comfortable for patients and personnel entrusted with the examination.

The pulse sequence shown acquires measurement data, in particular according to a PETRA pulse sequence scheme.

A schematic representation of a section of an additional pulse sequence for the acquisition of measurement data, with acquisition of correction data according to the invention, is shown in FIG. 4.

The radiated excitation pulses 26 and the acquisition blocks for the acquisition of the radio-frequency signals for acquisition 27 of the measurement data and acquisition 28 of the correction data are shown again in the upper line (RF). The switched gradients are shown in the second line G. The lower line t shows the time curve.

As is apparent, given the schematically shown pulse sequence that is used, in every repetition of duration TR (repetition time) gradients G (that are begun simultaneously with the beginning of the acquisition 27 of measurement data after an excitation pulse 26) are ramped up to a desired value in the current repetition. After the acquisition 27 of the measurement data, a spoiler gradient can possibly be switched before the next repetition begins with a new excitation pulse 26.

Every n repetitions, correction data are acquired (acquisition 28) before the beginning of the acquisition 27 of the measurement given still-deactivated gradients.

In an embodiment according to FIG. 4, an acquisition of correction data results that only slightly disrupts the course of the pulse sequence. Here it is not necessary to insert extra measurements between the repetitions of the acquisition of measurement data for the acquisition of the correction data; rather, the acquisitions of correction data can be integrated into the pulse sequence for acquisition of the measurement data, without time loss. The single necessary modification to the pulse sequence for acquisition of measurement data is that, every n repetitions, the data acquisition is already begun somewhat earlier than given only an acquisition of measurement data. The data acquired at these earlier points in time (acquisition 28) are simply stored as correction data, and not as measurement data. It should be ensured that the thus-shortened echo time TE' for the acquisition of the correction data is not shorter than is practical in view of the magnetic resonance system that is used (limitations due to hardware, for example switching time from transmission mode to reception mode of the radio-frequency antenna $T_{min}$).

In each case, in particular at least two acquisition points are acquired in the acquisition 28 of the correction data.

The echo times TE, TE'—i.e. the time periods between excitation pulse and beginning of the acquisition of the measurement data or the correction data—is shorter than 500 microseconds given the pulse sequences that are used. Purely FID data can therefore be acquired which can be used directly in an FID-based movement correction method described above.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to acquire correction data together magnetic resonance (MR) measurement data, comprising:
    from a computerized control unit, operating an MR data acquisition unit, in which an examination subject is disposed, according to pulse sequence that causes excitation of nuclear spins in the examination subject and acquisition of measurement data comprising magnetic resonance signals resulting from the excited nuclear spins, and having an echo time, between said excitation and said acquisition of measurement data that is less than 500 microseconds, and, in said pulse sequence, activating a magnetic field gradient in said MR data acquisition unit that spatially codes said measurement data;
    from said computerized control unit, operating said MR data acquisition unit to repeat said pulse sequence in a plurality of repetitions and, in each repetition, activating a different magnetic field gradient; and
    from said computerized control unit, operating said MR data acquisition unit to acquire correction data from said examination subject during said time window in every $n^{th}$ repetition, in said plurality of repetitions, in which no gradient magnetic field is activated, wherein n is a predetermined natural number; and
    making said measurement data and said correction data available in electronic form, in at least one data file, at an output of said control unit.

2. A method as claimed in claim 1 comprising acquiring said correction data during a free induction decay (FID) that occurs immediately following said excitation of said nuclear spins.

3. A method as claimed in claim 2 comprising providing said at least one data file to a computerized processor and, in said computerized processor, executing an FID-based movement correction algorithm, using said correction data and said measurement data, to correct said measurement data for movement of said examination subject.

4. A method as claimed in claim 3 wherein said MR data acquisition unit comprises a multi-channel reception coil comprising multiple individual coils, and acquiring said correction data with said multi-channel reception coil, and, in said FID-based movement correction algorithm, analyzing the acquired correction data on a coil-by-coil basis.

5. A method as claimed in claim 1 comprising, from said computerized control unit, operating said MR data acquisition unit by radiating an excitation pulse in said pulse sequence and activating said magnetic field gradient during radiation of said excitation pulse and, in each nth repetition of said pulse sequence, ramping down said magnetic field gradient and deactivating said magnetic field gradient to produce said time window in which said correction data are acquired.

6. A method as claimed in claim 5 wherein said MR data acquisition unit comprises a gradient coil system that is operated by said computerized control unit to activate said magnetic field gradient, and comprising ramping down said magnetic field gradient with a slew rate selected to ideally produce no mechanical stress on said gradient coil system.

7. A method as claimed in claim 5 comprising, from said computerized control unit, operating said MR data acquisition unit with a PETRA pulse sequence, as said pulse sequence.

8. A method as claimed in claim 1 comprising, from said computerized control unit, operating said MR data acquisition unit to radiate an excitation pulse that excites said nuclear spins in said pulse sequence and thereafter ramping up said magnetic field gradient in order to acquire said measurement data and, in each $n^{th}$ repetition, acquiring said correction data before beginning acquisition of said measurement data.

9. A magnetic resonance (MR) system comprising:
an MR data acquisition unit;
a computerized control unit configured to operate the MR data acquisition unit, in which an examination subject is disposed, according to pulse sequence that causes excitation of nuclear spins in the examination subject and acquisition of measurement data comprising magnetic resonance signals resulting from the excited nuclear spins, and having an echo time, between said excitation and said acquisition of measurement data that is less than 500 microseconds, and, in said pulse sequence, to activate a magnetic field gradient in said MR data acquisition unit that spatially codes said measurement data;
from said computerized control unit being configured to operate said MR data acquisition unit to repeat said pulse sequence in a plurality of repetitions and, in each repetition, activate a different magnetic field gradient; and
said computerized control unit being configured to operate said MR data acquisition unit to acquire correction data from said examination subject during said time window in every $n^{th}$ repetition, in said plurality of repetitions, in which no gradient magnetic field is activated, wherein n is a predetermined natural number; and
said control unit being configured to make said measurement data and said correction data available in electronic form, in at least one data file, at an output of said control unit.

10. A non-transitory, computer-readable data storage medium encoded with programming instructions, said data storage medium being loaded into a computerized control unit of a magnetic resonance (MR) apparatus, said MR apparatus also comprising an MR data acquisition unit, and said programming instructions causing said computerized control unit to:
operate the MR data acquisition unit, in which an examination subject is disposed, according to pulse sequence that causes excitation of nuclear spins in the examination subject and acquisition of measurement data comprising magnetic resonance signals resulting from the excited nuclear spins, and having an echo time, between said excitation and said acquisition of measurement data that is less than 500 microseconds, and, in said pulse sequence, activate a magnetic field gradient in said MR data acquisition unit that spatially codes said measurement data;
operate said MR data acquisition unit to repeat said pulse sequence in a plurality of repetitions and, in each repetition, activating a different magnetic field gradient; and
operate said MR data acquisition unit to acquire correction data from said examination subject during a time window in every $n^{th}$ repetition, in said plurality of repetitions, in which no gradient magnetic field is activated, wherein n is a predetermined natural number; and
make said measurement data and said correction data available in electronic form, in at least one data file, at an output of said control unit.

* * * * *